(12) United States Patent
Oh

(10) Patent No.: US 10,037,984 B2
(45) Date of Patent: Jul. 31, 2018

(54) DISPLAY DEVICE

(71) Applicant: Samsung Display Co., Ltd., Yongin-si (KR)

(72) Inventor: Myongsoo Oh, Asan-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 15/593,226

(22) Filed: May 11, 2017

(65) Prior Publication Data

US 2018/0068992 A1    Mar. 8, 2018

(30) Foreign Application Priority Data

Sep. 6, 2016    (KR) .................. 10-2016-0114321

(51) Int. Cl.
| | |
|---|---|
| *H01L 25/18* | (2006.01) |
| *H01L 23/538* | (2006.01) |
| *H01L 27/12* | (2006.01) |
| *H01L 27/32* | (2006.01) |
| *G02F 1/1345* | (2006.01) |

(52) U.S. Cl.
CPC .......... *H01L 25/18* (2013.01); *H01L 23/5385* (2013.01); *H01L 27/124* (2013.01); *G02F 1/13452* (2013.01); *G02F 1/13458* (2013.01); *H01L 27/3276* (2013.01)

(58) Field of Classification Search
CPC ....... H01L 25/18; H01L 27/124; H01L 23/52; H01L 23/5385; H01L 2021/775; H01L 27/3276; G02F 1/13452; G02F 1/13458
See application file for complete search history.

(56) References Cited

U.S. PATENT DOCUMENTS

| | | | |
|---|---|---|---|
| 9,269,285 B2* | 2/2016 | Lee ...................... | G09G 3/006 |
| 2008/0119061 A1 | 5/2008 | Hwang et al. | |
| 2015/0076531 A1 | 3/2015 | Kim | |
| 2015/0301372 A1* | 10/2015 | Mori ..................... | G02F 1/1339 |
| | | | 349/33 |
| 2016/0307526 A1* | 10/2016 | Shibata ................ | G09G 3/3614 |
| 2017/0343877 A1* | 11/2017 | Kim ..................... | G02F 1/1368 |

FOREIGN PATENT DOCUMENTS

| | | |
|---|---|---|
| KR | 10-2001-0037207 | 5/2001 |
| KR | 10-2007-0047950 | 5/2007 |
| KR | 10-2008-0046021 | 5/2008 |
| KR | 10-2015-003115 | 3/2015 |

* cited by examiner

*Primary Examiner* — Thanh T Nguyen
(74) *Attorney, Agent, or Firm* — H.C. Park & Associates, PLC

(57) ABSTRACT

A display device including: a substrate including a display area and a non-display area; a first pad terminal and a second pad terminal disposed in the non-display area, the first pad terminal arranged along a first row and the second pad terminal arranged along a second row; a first connection unit connected to the first pad terminal; a first driving integrated circuit connected to the first connection unit; a second connection unit connected to the second pad terminal; and a second driving integrated circuit connected to the second connection unit, wherein first connection unit is disposed overlapping the second connection unit.

19 Claims, 14 Drawing Sheets

DISPLAY DEVICE

CROSS-REFERENCE TO RELATED APPLICATION

This application claims priority from and the benefit of Korean Patent Application No. 10-2016-0114321, filed on Sep. 6, 2016, which is hereby incorporated by reference for all purposes as if fully set forth herein.

FIELD

Exemplary embodiments relate to a display device. More particularly, exemplary embodiments relate to a display device capable of reducing manufacturing costs and substantially minimizing or reducing a defective rate.

DISCUSSION OF THE BACKGROUND

Liquid crystal display ("LCD") devices are a type of flat panel display ("FPD") device that is widely used recently. An LCD device generally includes two substrates including electrodes disposed thereon and a liquid crystal layer interposed between the two substrates.

Upon applying voltage to the two electrodes, liquid crystal molecules of the liquid crystal layer may be rearranged such that an amount of transmitted light may be controlled in the LCD device.

The above information disclosed in this Background section is only for enhancement of understanding of the background of the inventive concepts, and, therefore, it may contain information that does not form the prior art that is already known in this country to a person of ordinary skill in the art.

SUMMARY

Exemplary embodiments provide a display device capable of reducing manufacturing costs and substantially minimizing or reducing defects.

Additional aspects will be set forth in the detailed description which follows, and, in part, will be apparent from the disclosure, or may be learned by practice of the inventive concepts.

According to an exemplary embodiment, a display device includes: a substrate including a display area and a non-display area; a first pad terminal and a second pad terminal disposed in the non-display area, the first pad terminal arranged along a first row and the second pad terminal arranged along a second row; a first connection unit connected to the first pad terminal; a first driving integrated circuit connected to the first connection unit; a second connection unit connected to the second pad terminal; and a second driving integrated circuit connected to the second connection unit, wherein the first connection unit is disposed overlapping the second connection unit.

A portion of the first connection unit may be disposed between the substrate and the second connection unit.

The second connection unit may overlap at least a portion of the first pad terminal.

The display device may further include a printed circuit board connected to the first connection unit and the second connection unit.

The first connection unit may include: a first lead line connected to the first pad terminal and a first terminal of the first driving integrated circuit; and a second lead line connected to a second terminal of the first driving integrated circuit and the printed circuit board.

The second connection unit may include: a first lead line connected to the second pad terminal and a first terminal of the second driving integrated circuit; and a second lead line connected to a second terminal of the second driving integrated circuit and the printed circuit board.

The first lead line of the first connection unit may intersect the first lead line of the second connection unit.

The second lead line of the first connection unit may not intersect the second lead line of the second connection unit.

One side of the first connection unit may overlap the substrate and may not intersect an edge of the substrate, another side of the first connection unit opposite to the one side of the first connection unit may overlap the printed circuit board and may not intersect an edge of the printed circuit board, and the one side of the first connection unit may have a longer length than a length of the another side of the first connection unit.

One side of the second connection unit may overlap the substrate and may not intersect an edge of the substrate, another side of the second connection unit opposite to the one side of the second connection unit may overlap the printed circuit board and may not intersect an edge of the printed circuit board, and the one side of the second connection unit may have a longer length than a length of the another side of the second connection unit.

The first connection unit and the second connection unit may be symmetric to each other.

The display device may further include: a third pad terminal to an n-th pad terminal (n being a natural number equal to or greater than 3) arranged along a third row to an n-th row, respectively, in the non-display area; and a third connection unit to an n-th connection unit connected to the third pad terminal to the n-th pad terminal, respectively, and overlapping at least one of the first connection unit and the second connection unit.

According to an exemplary embodiment, a display device includes: a substrate including a display area and a non-display area; a first pad terminal and a second pad terminal disposed in the non-display area, the first pad terminal arranged along a first row and the second pad terminal arranged along a second row; a first connection unit connected to the first pad terminal; a driving integrated circuit disposed on the first connection unit; and a second connection unit connected to the second pad terminal and the first connection unit, the second connection unit overlapping the first connection unit.

A portion of the first connection unit may be disposed between the substrate and the second connection unit.

The second connection unit may overlap at least a portion of the first pad terminal.

The display device may further include a printed circuit board connected to the first connection unit.

The first connection unit may include: a first lead line connected to the first pad terminal and a first terminal of the driving integrated circuit; a second lead line connected to a second terminal of the driving integrated circuit and the second connection unit; and a third lead line connected to a third terminal of the driving integrated circuit and the printed circuit board.

The second connection unit may include a lead line connected to the second pad terminal and one of the second terminal and the second lead line.

The display device may further include: a third pad terminal to an n-th pad terminal (n being a natural number equal to or greater than 3) arranged along a third row to an n-th row, respectively, in the non-display area; and a third connection unit to an n-th connection unit connected to the third pad terminal to the n-th pad terminal, respectively, and overlapping at least one of the first connection unit and the second connection unit, wherein the third connection unit to the n-th connection unit may be connected to the first connection unit.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
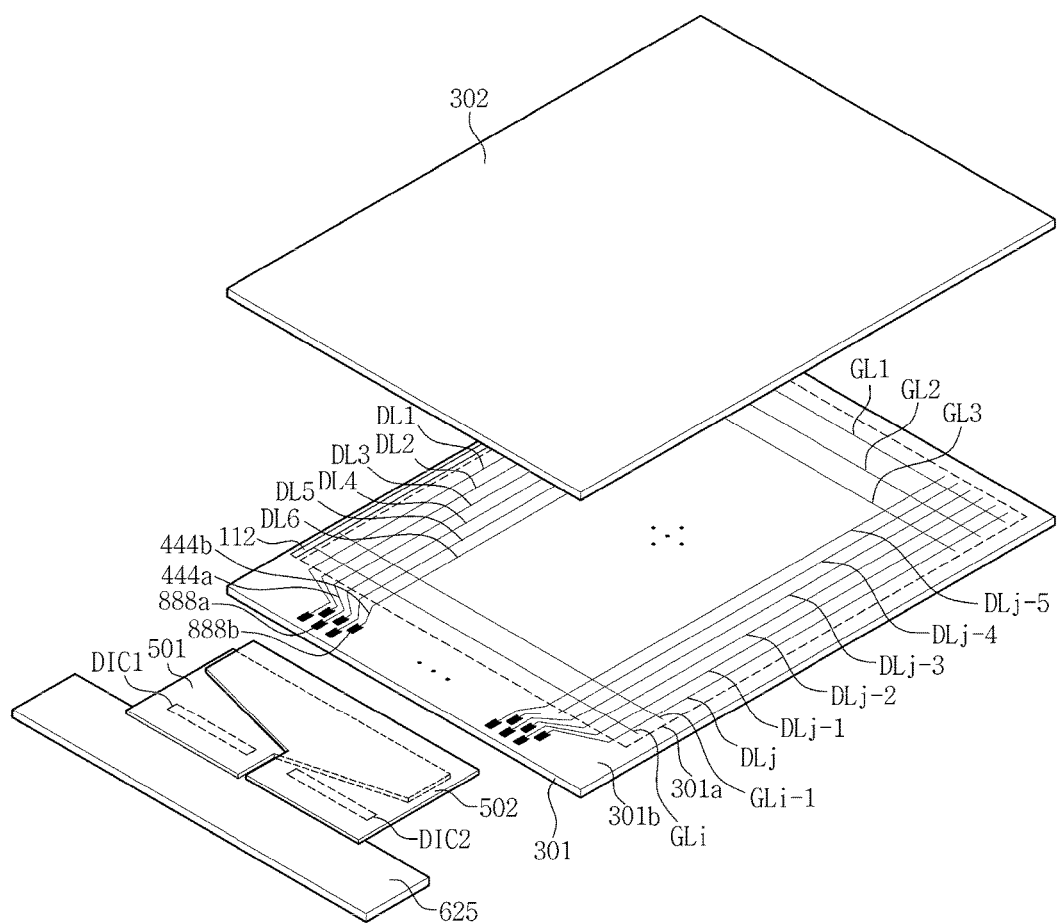
FIG. 1 is an exploded perspective view of a display device according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. As such, the regions illustrated in the drawings are schematic in nature and their shapes are not necessarily intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
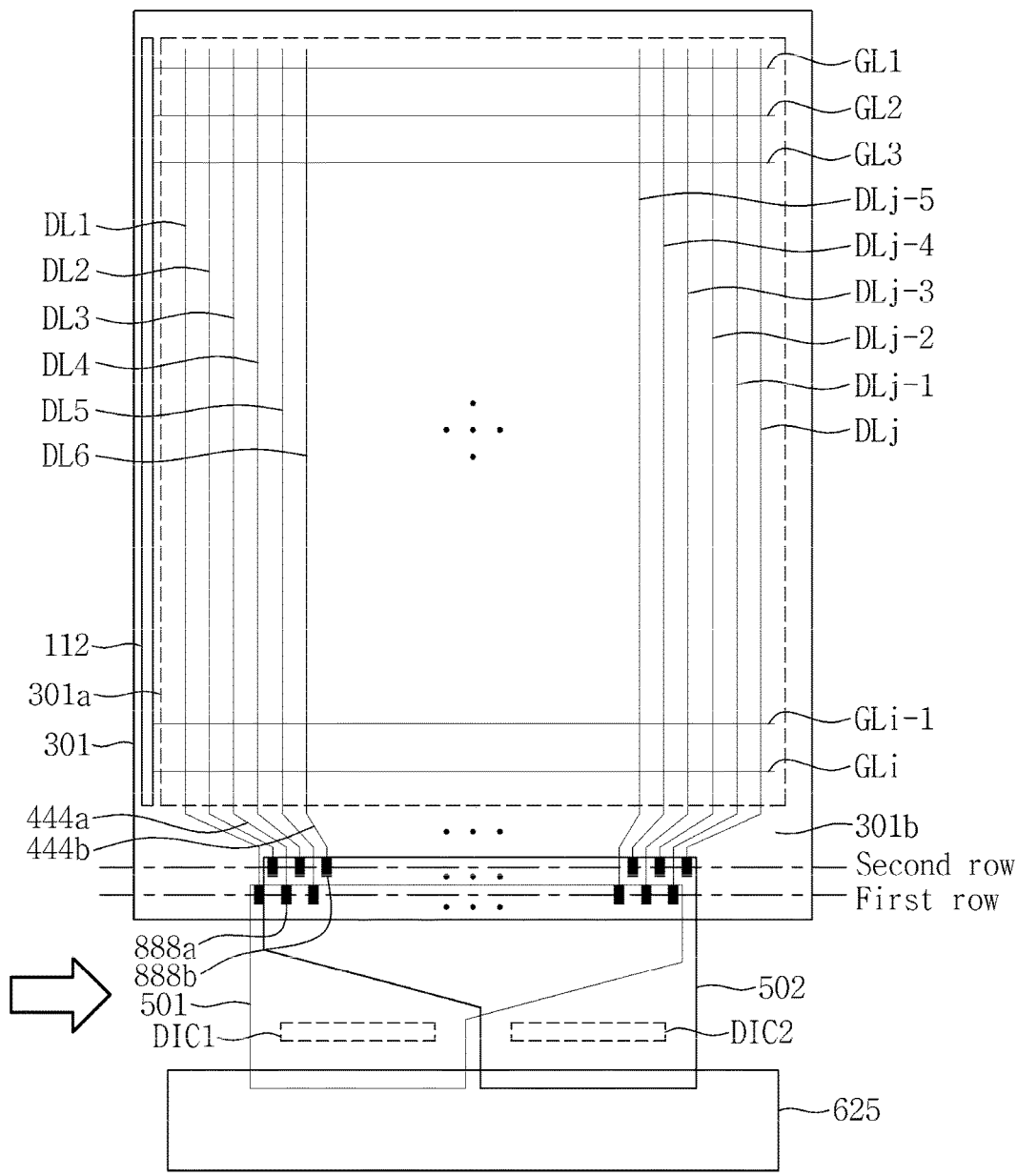
FIG. 2 is a plan view illustrating a first substrate, a first data driving integrated circuit ("IC"), a second data driving IC, a first connection unit, a second connection unit, and a printed circuit board ("PCB") of FIG. 1 when they are coupled to one another.

FIG. 1 is an exploded perspective view illustrating a display device according to an exemplary embodiment, and FIG. 2 is a plan view of the display device of FIG. 1, according to an exemplary embodiment. Referring to FIG. 2, the display device may include a first substrate 301, a first data driving integrated circuit ("IC") DIC1, a second data driving IC DIC2, a first connection unit 501, a second connection unit 502, and a printed circuit board ("PCB") 625 coupled together.

Referring to FIG. 1, the display device according to an exemplary embodiment may include the first substrate 301, a second substrate 302, a gate driver 112, the first data driving IC DIC1, the second data driving IC DIC2, the first connection unit 501, the second connection unit 502, a plurality of gate lines GL1 to GLi, a plurality of data lines DL1 to DLj, and the PCB 625.

A liquid crystal layer or an organic light emitting layer may be further disposed between the first substrate 301 and the second substrate 302.

The first substrate 301 has a display area 301a and a non-display area 301b. A plurality of pixels are arranged in the display area 301a.

Each of the plurality of pixels may include a switching element, a pixel electrode, and a common electrode. The switching element may include a gate electrode connected to the gate line, a source electrode connected to the data line, and a drain electrode connected to the pixel electrode. The switching element is also referred to as a thin film transistor ("TFT").

The common electrode may be disposed on the second substrate 302, and the liquid crystal layer or the organic light emitting layer may be disposed between the common electrode and the pixel electrode. According to the exemplary embodiments, the common electrode may be disposed on the first substrate 301.

In addition, the pixel may further include a color filter and a light shielding layer, and the color filter and the light shielding layer may be disposed on the first substrate or the second substrate. The light shielding layer may also be commonly referred to as a black matrix.

The plurality of gate lines GL1 to GLi are disposed in the display area 301a of the first substrate 301. Each of the gate lines GL1 to GLi extends to the non-display area 301b and is connected to the gate driver 112.

The gate driver 112 is disposed in the non-display area 301b of the first substrate 301. The gate driver 112 drives the gate lines GL1 to GLi. The gate driver 112 generates gate signals and sequentially applies the gate signals to the gate lines GL1 to GLi.

The plurality of data lines DL1 to DLj are disposed in the display area 301a of the first substrate 301. The data lines DL1 to DLj intersect the gate lines GL1 to GLi. Each of the data lines DL1 to DLj extends to the non-display area 301b and is connected to either one of the first connection unit 501 and the second connection unit 502. For example, between the data lines DL1 to DLj, odd-numbered data lines DL1, DL3, DL5, . . . , DLj−5, DLj−3, and DLj−1 may be connected to the first connection unit 501 and even-numbered data lines DL2, DL4, DL6, . . . , DLj−4, DLj−2, and DLj may be connected to the second connection unit 502.

The data line may be connected to corresponding one of the connection units through link lines 444a and 444b. For example, the odd-numbered data lines DL1, DL3, DL5, . . . , DLj−5, DLj−3, and DLj−1 may be connected to the first connection unit 501 through odd-numbered link lines 444a, respectively, and the even-numbered data lines DL2, DL4, DL6, . . . , DLj−4, DLj−2, and DLj may be connected to the second connection unit 502 through even-numbered link lines 444b, respectively. The number of the link lines is equal to the number of the data lines. The link lines may also be referred to as fan-out lines.

Referring to FIG. 2, As a more detailed example of the data line, the link line, and the connection unit, the third data line DL3 may be connected to the first connection unit 501 through the odd-numbered link line 444a, and the sixth data line DL6 may be connected to the second connection unit 502 through the even-numbered link line 444b.

A portion of the link line connected to the corresponding connection unit is to be defined as pad terminals 888a and 888b of the link line. The pad terminals 888a and 888b may be disposed at an end portion of the link lines 444a and 444b. The pad terminals 888a and 888b may have a larger area than an area of another portion of the link line 444a or 444b.

Among the pad terminals 888a and 888b, a pad terminal 888a (hereinafter, an odd-numbered pad terminal) of the odd-numbered link line 444a is connected to the odd-numbered data line, and a pad terminal 888b (hereinafter, an even-numbered pad terminal) of the even-numbered link line 444b is connected to the even-numbered data line. For example, Referring to FIG. 2, the pad terminal 888a of the odd-numbered link line 444a is connected to the third data line DL3, and the pad terminal 888b of the even-numbered link line 444b is connected to the sixth data line DL6.

Referring to FIGS. 1 and 2, the odd-numbered pad terminals 888a and the even-numbered pad terminals 888b are arranged along different rows. For example, the odd-numbered pad terminals 888a are arranged in a line along a first row that is disposed farther away from the display area 301a than the even-numbered pad terminals 888b, and the even-numbered pad terminals 888b are arranged in a line along a second row that is disposed closer to the display area 301a than the odd-numbered pad terminals 888a.

In other words, the odd-numbered pad terminals 888a are disposed in a portion of the non-display area 301b farther away from the display area 301a than a portion of the non-display area 301b in which the even-numbered pad terminals 888b are disposed, and are arranged therein in the first row extending parallel to a length direction of the gate line. In addition, the even-numbered pad terminals 888b are disposed in a portion of the non-display area 301b closer to the display area 301a than a portion of the non-display area 301b in which the odd-numbered pad terminals 888a are disposed, and are arranged therein in the second row extending parallel to the length direction of the gate line.

The even-numbered pad terminal 888b is disposed between two adjacent odd-numbered link lines 444a. A rightmost one of the even-numbered pad terminals 888b, i.e., a last pad terminal, is disposed between a rightmost one of the odd-numbered link lines 444a and a right edge of the first substrate 301.

According to an exemplary embodiment, the pad terminals in the first row may not be an odd-numbered pad terminal. For example, the pad terminals in the first row may include at least one odd-numbered pad terminal 888a and at least one even-numbered pad terminal 888b. In addition, the pad terminals in the second row may not be an even-numbered pad terminal. For example, the pad terminals in the second row may include at least one odd-numbered pad terminal 888a and at least one even-numbered pad terminal 888b that are different from the pad terminals in the first row. However, at least one pad terminal in the second row is disposed between two link lines 444a that are respectively connected to two pad electrodes in the first row. In such an exemplary embodiment, the two pad electrodes in the first row are adjacent to each other.

The first connection unit 501 is connected to the first substrate 301 and the PCB 625. For example, an input portion of the first connection unit 501 may be electrically connected to the PCB 625, and an output portion of the first connection unit 501 may be electrically connected to the non-display area 301b of the first substrate 301.

The first connection unit 501 and the first substrate 301 may be electrically connected to each other by an anisotropic conductive film. Similarly, the first connection unit 501 and the PCB 625 may be electrically connected to each other by an anisotropic conductive film.

The output portion of the first connection unit 501 is connected to the odd-numbered pad terminals 888a. In other words, the output portion of the first connection unit 501 is connected to the odd-numbered pad terminals 888a arranged along the first row. According to an exemplary embodiment, the first connection unit 501 may not be connected only to the odd-numbered pad terminals 888a. For example, the first connection unit 501 may be connected to at least a part of the entire pad terminals. The at least a part of the entire pad terminals may include at least one odd-numbered pad terminal 888a and at least one even-numbered pad terminal 888b.

The second connection unit 502 is connected to the first substrate 301 and the PCB 625. For example, an input portion of the second connection unit 502 may be electrically connected to the PCB 625, and an output portion of the second connection unit 502 may be electrically connected to the non-display area 301b of the first substrate 301.

The second connection unit 502 and the first substrate 301 may be electrically connected to each other by an anisotropic conductive film. Similarly, the second connection unit 502 and the PCB 625 may be electrically connected to each other by an anisotropic conductive film.

The output portion of the second connection unit 502 is connected to the even-numbered pad terminals 888b. In other words, the output portion of the second connection unit 502 is connected to the even-numbered pad terminals 888b arranged along the second row. According to an exemplary embodiment, the second connection unit 502 may not be connected only to the even-numbered pad terminals 888b. For example, the second connection unit 502 may be connected to the pad terminals that are not connected to the first connection unit 501. The pad terminals connected to the second connection unit 502 may include at least one odd-numbered pad terminal 888a and at least one even-numbered pad terminal 888b. However, at least one pad terminal connected to the second connection unit 502 is disposed between two link lines connected to the first connection unit 501 through pad terminals. In such an exemplary embodiment, the two link lines connected to the first connection unit 501 are adjacent to each other.

At least one of the odd-numbered pad terminals 888a connected to the first connection unit 501 is connected to a link line 444a passing between the even-numbered pad terminals 888b connected to the second connection unit 502. For example, referring to FIG. 2, one odd-numbered pad terminal 888a connected to the third data line DL3 is connected to the first connection unit 501, and a link line 444a through which the third data line DL3 is connected to the odd-numbered pad terminal 888a extends past the two adjacent even-numbered pad terminals 888b. The two adjacent even-numbered pad terminals 888b are connected to the second connection unit 502. In other words, at least one of the odd-numbered data lines DL1, DL3, DL5, . . . , DLj−5, DLj−3, and DLj−1 connected to the first connection unit 501 is disposed between two adjacent even-numbered data lines connected to the second connection unit 502.

At least one of the even-numbered pad terminals 888b connected to the second connection unit 502 is disposed between the two adjacent odd-numbered link lines 444a connected to the first connection unit 501. For example, referring to FIG. 2, an even-numbered pad terminal 888b connected to the second data line DL2 is connected to the second connection unit 502, and the even-numbered pad terminal 888b connected to the second data line DL2 is disposed between the two adjacent odd-numbered link lines 444a. The two adjacent odd-numbered link lines 444a are connected to the first connection unit 501 through respective pad terminals 888a. In other words, at least one of the even-numbered data lines DL2, DL4, DL6, . . . , DLj−4, DLj−2, and DLj connected to the second connection unit 502 may be disposed between the two adjacent odd-numbered data lines connected to the first connection unit 501.

The first connection unit 501 overlaps at least a part of the second connection unit 502. For example, at least a portion of the first connection unit 501 overlaps the second connection unit 502.

Referring to FIGS. 1 and 2, a portion of the first connection unit 501 may be disposed between the first substrate 301 and the second connection unit 502. For example, in an area where the first connection unit 501 overlaps the second connection unit 502, a portion of the first connection unit 501 may be disposed between the first substrate 301 and the second connection unit 502.

The second connection unit 502 overlaps at least one of the odd-numbered pad terminals 888a.

At least one of the first connection unit 501 and the second connection unit 502 may be a tape carrier. At least one of the first connection unit 501 and the second connection unit 502 may also be a flexible printed circuit (FPC).

The first data driving IC DIC1 is connected to the first connection unit 501. To this end, the first data driving IC DIC1 may be mounted on the first connection unit 501. For example, the first data driving IC DIC1 may be electrically connected to the first connection unit 501 by surface mounting technology.

The first data driving IC DIC1 is connected to the odd-numbered pad terminals 888a through the first connection unit 501. For example, output terminals of the first data driving IC DIC1 are connected to the odd-numbered pad terminals 888a, respectively, through the output portion of the first connection unit 501. Accordingly, the output terminals of the first data driving IC DIC1 are connected to the odd-numbered data lines DL1, DL3, DL5, . . . , DLj−5, DLj−3, and DLj−1 through the odd-numbered link lines 444a, respectively.

The first data driving IC DIC1 provides image data signals to the odd-numbered data lines DL1, DL3, DL5, . . . , DLj−5, DLj−3, and DLj−1.

The second data driving IC DIC2 is connected to the second connection unit 502. To this end, the second data driving IC DIC2 may be mounted on the second connection unit 502. For example, the second data driving IC DIC2 may be electrically connected to the second connection unit 502 by surface mounting technology.

The second data driving IC DIC2 is connected to the even-numbered pad terminals 888b through the second connection unit 502. For example, output terminals of the second data driving IC DIC2 are connected to the even-numbered pad terminals 888b, respectively, through the output portion of the second connection unit 502. Accordingly, the output terminals of the second data driving IC DIC2 are connected to the even-numbered data lines DL2, DL4, DL6, . . . , DLj−4, DLj−2, and DLj through the even-numbered link lines 444b, respectively.

The second data driving IC DIC2 provides image data signals to the even-numbered data lines DL2, DL4, DL6, . . . , DLj−4, DLj−2, and DLj.

Figure 3:
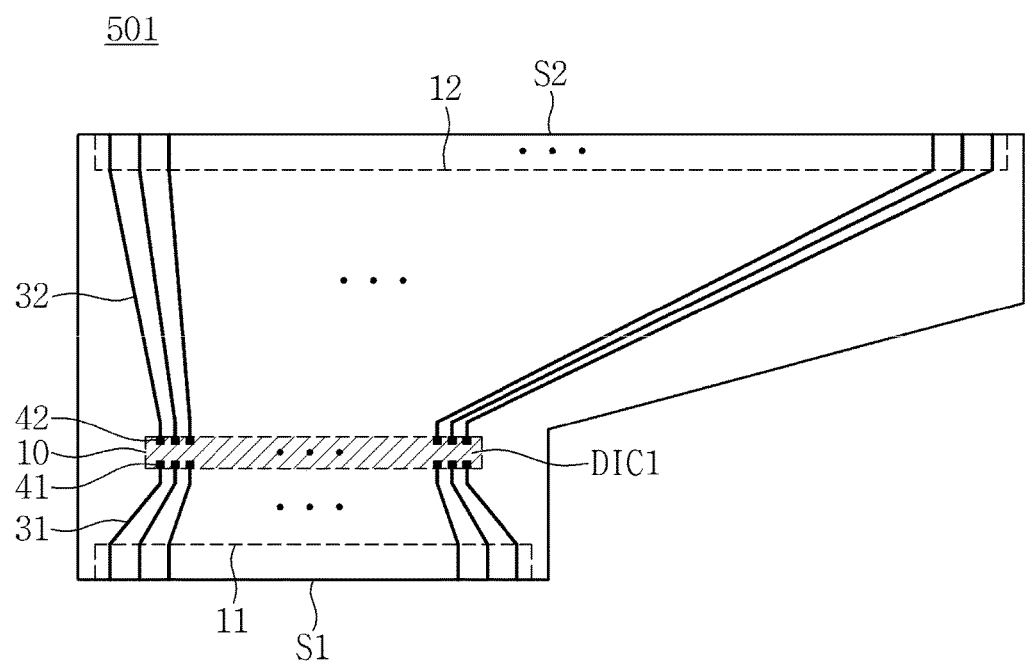
FIG. 3 is a plan view of the first connection unit of FIG. 2, according to an exemplary embodiment.
Figure 4:
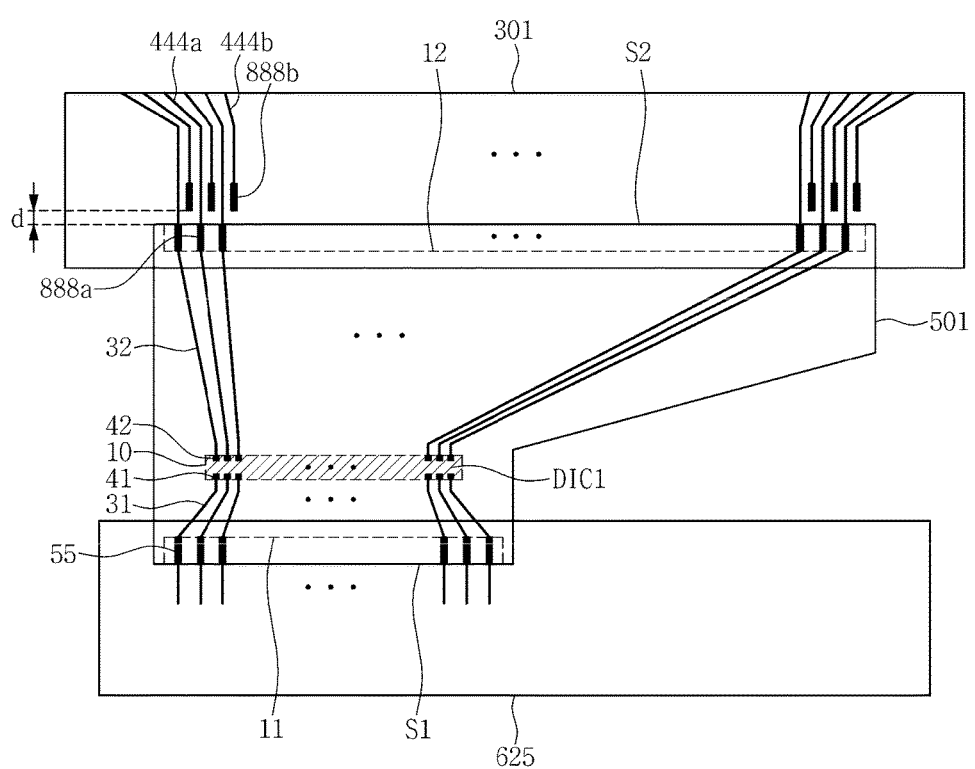
FIG. 4 is a plan view illustrating electrical connections between the first connection unit of FIG. 3, the PCB, and the first substrate, according to an exemplary embodiment.

FIG. 3 is a plan view of the first connection unit 501 of FIG. 2, according to an exemplary embodiment, and FIG. 4 is a plan view illustrating electrical connections between the first connection unit 501 of FIG. 3, the PCB 625, and the first substrate 301, according to an exemplary embodiment.

Referring to FIG. 3, the first connection unit 501 includes a plurality of input lead lines 31, a plurality of output lead lines 32, a mounting portion 10, an input portion 11, and an output portion 12.

The first data driving IC DIC1 is mounted in the mounting portion 10. The mounting portion 10 is disposed between the input portion 11 and the output portion 12.

Referring to FIG. 4, the input portion 11 is connected to the PCB 625, and the output portion 12 is connected to the first substrate 301.

The input portion 11 is disposed adjacent to one side S1 (hereinafter, a first side) of the first connection unit 501.

The output portion 12 is disposed adjacent to another side S2 (hereinafter, a second side) of the first connection unit 501. The second side S2 is disposed opposite to the first side S1.

Referring to FIG. 4, the first side S1 of the first connection unit 501 overlaps the PCB 625. According to an exemplary embodiment, the first side S1 does not intersect an edge of the PCB 625.

Referring to FIG. 4, the second side S2 of the first connection unit 501 overlaps the first substrate 301. According to an exemplary embodiment, the second side S2 does not intersect an edge of the first substrate 301. Referring to FIGS. 3 and 4, a length of the second side S2 may be longer length than a length of the first side S1.

Referring to FIG. 3, the input lead lines 31 are connected to input terminals 41 of the first data driving IC DIC1, respectively. Referring to FIG. 4, the input lead lines 31 are connected to pad terminals 55 of the PCB 625, respectively. For example, one end portion of the input lead line 31 is connected to the input terminal 41 of the first data driving IC DIC1 and another end portion of the input lead line 31 is connected to the pad terminal 55 of the PCB 625.

One end portion of each input lead line 31 is exposed from the first connection unit 501 through the mounting portion 10 and another end portion of each input lead line 31 is exposed from the first connection unit 501 through the input portion 11.

Referring to FIG. 3, the output lead lines 32 are connected to output terminals 42 of the first data driving IC DIC1, respectively. In addition, referring to FIG. 4, the output lead lines 32 are connected to the odd-numbered pad terminals 888a of the first substrate 301, respectively. For example, one end portion of the output lead line 32 is connected to the output terminal 42 of the first data driving IC DIC1, and another end portion of the output lead line 32 is connected to the odd-numbered pad terminal 888a of the first substrate 301.

One end portion of each output lead line 32 is exposed from the first connection unit 501 through the mounting portion 10, and another end portion of each output lead line 32 is exposed from the first connection unit 501 through the output portion 12.

Referring to FIG. 4, a distance d between the odd-numbered pad terminal 888a and the even-numbered pad terminal 888b may be about 200 μm or more. In other words, a distance between the first row and the second row may be about 200 μm or more. The distance between the first row and the second row may prevent or reduce detachment of the second connection unit 502.

Figure 5:
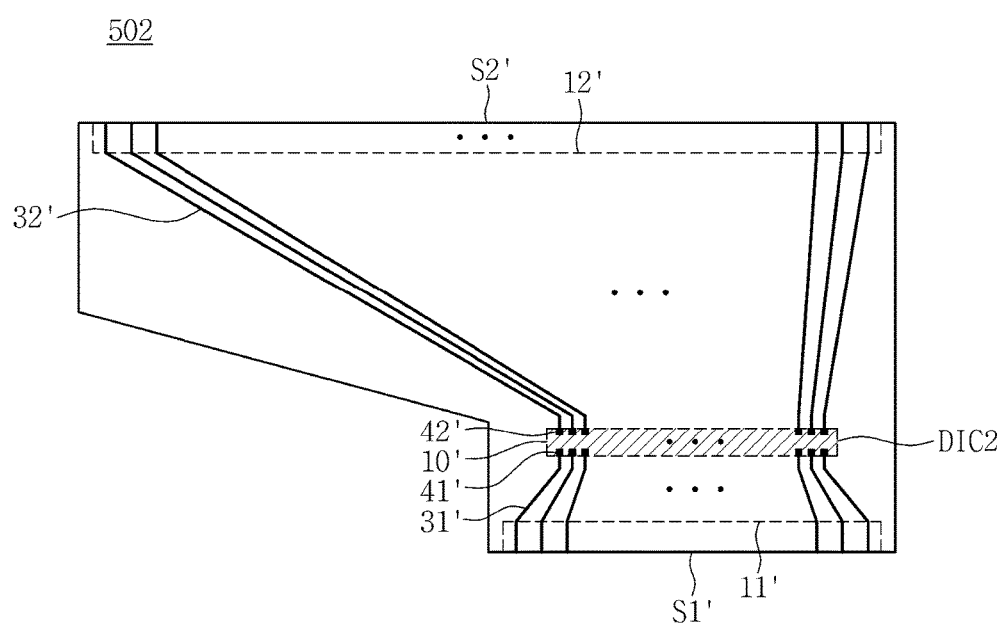
FIG. 5 is a plan view of the second connection unit of FIG. 2, according to an exemplary embodiment.
Figure 6:
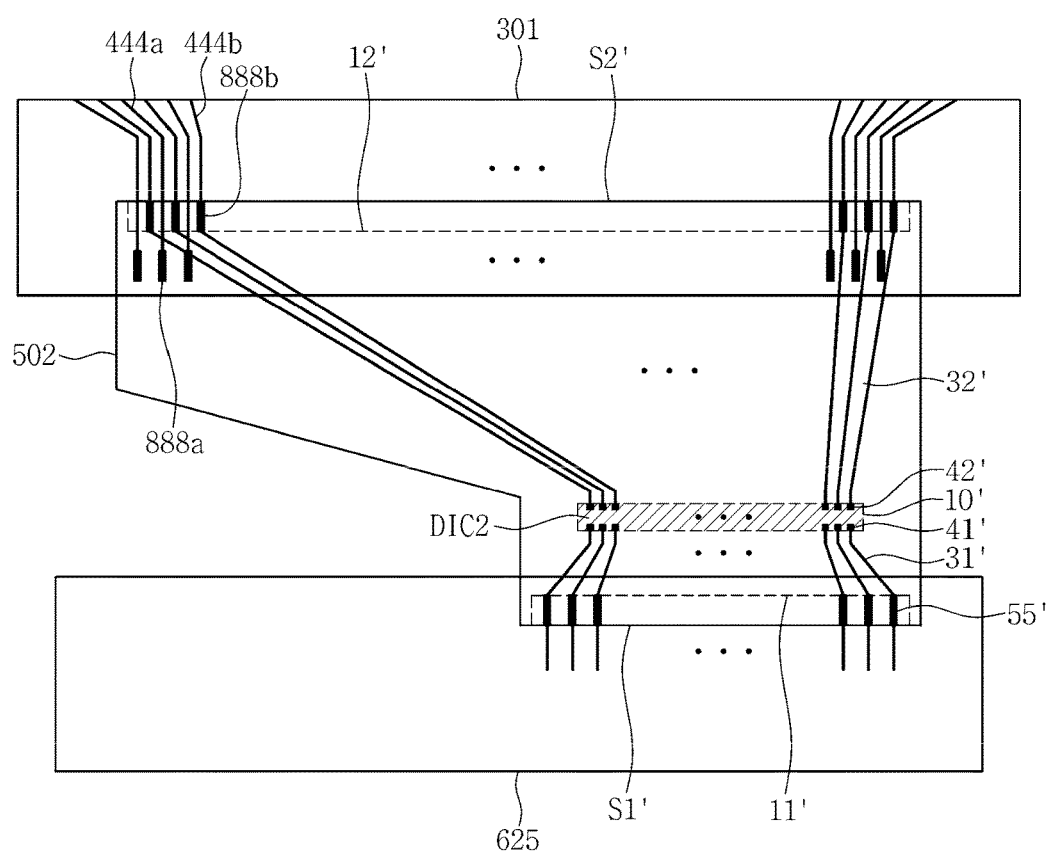
FIG. 6 is a plan view illustrating electrical connections between the second connection unit of FIG. 5, the PCB, and the first substrate, according to an exemplary embodiment.

FIG. 5 is a plan view of the second connection unit 502 of FIG. 2, and FIG. 6 is a plan view illustrating electrical connections between the second connection unit 502 of FIG. 5, the PCB 625, and the first substrate 301, according to an exemplary embodiment.

Referring to FIG. 4, the second connection unit 502 includes a plurality of input lead lines 31', a plurality of output lead lines 32', a mounting portion 10', an input portion 11', and an output portion 12'.

The second data driving IC DIC2 is mounted in the mounting portion 10'. The mounting portion 10' is disposed between the input portion 11' and the output portion 12'.

Referring to FIG. 6, the input portion 11' is connected to the PCB 625, and the output portion 12' is connected to the first substrate 301.

The input portion 11' is disposed adjacent to one side S1' (hereafter, a first side) of the second connection unit 502.

The output portion 12' is disposed adjacent to another side S2' (hereinafter, a second side) of the second connection unit 502. The second side S2' is disposed opposite to the first side S1'.

Referring to FIG. 6, the first side S1' of the second connection unit 502 described above overlaps the PCB 625. According to an exemplary embodiment, the first side S1' does not intersect an edge of the PCB 625.

Referring to FIG. 6, the second side S2' of the second connection unit 502 overlaps the first substrate 301. According to an exemplary embodiment, the second side S2' does not intersect an edge of the first substrate 301. Referring to FIGS. 5 and 6, a length of the second side S2' may be longer length than a length of the first side S1'.

Referring to FIG. 5, the input lead lines 31' are connected to input terminals 41' of the second data driving IC DIC2, respectively. Referring to FIG. 6, the input lead lines 31' are connected to other pad terminals 55' of the PCB 625, respectively. For example, one end portion of the input lead line 31' is connected to the input terminal 41' of the second data driving IC DIC2, and another end portion of the input lead line 31' is connected to said another pad terminal 55' of the PCB 625.

One end portion of each input lead line 31' is exposed from the second connection unit 502 through the mounting portion 10', and another end portion of each input lead line 31' is exposed from the second connection unit 502 through the input portion 11'.

Referring to FIG. 5, the output lead lines 32' are connected to output terminals 42' of the second data driving IC DIC2, respectively. In addition, referring to FIG. 6, the output lead lines 32' are connected to the even-numbered pad terminals 888b of the first substrate 301, respectively. For example, one end portion of the output lead line 32' is connected to the output terminal 42' of the second data driving IC DIC2, and another end portion of the output lead line 32' is connected to the even-numbered pad terminal 888b of the first substrate 301.

One end portion of each output lead line 32' is exposed from the second connection unit 502 through the mounting portion 10', and another end portion of each output lead line 32' is exposed from the second connection unit 502 through the output portion 12'.

Figure 7:
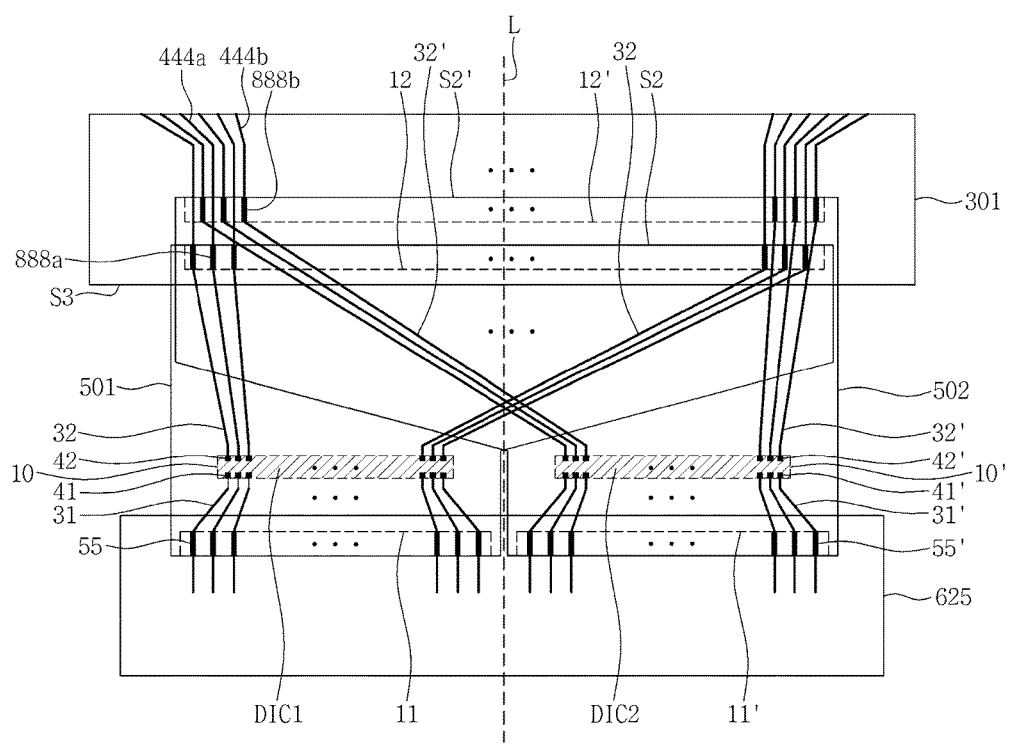
FIG. 7 is a plan view of the first connection unit of FIG. 4 and the second connection unit of FIG. 6, according to an exemplary embodiment.

FIG. 7 is a plan view of the first connection unit 501 of FIG. 4 and the second connection unit 502 of FIG. 6, according to an exemplary embodiment.

Referring to FIG. 7, the first connection unit 501 and the second connection unit 502 may be disposed symmetric to each other. For example, assuming an imaginary line L extending in the center of the first substrate 301 parallel to the data line, the first connection unit 501 and the second connection unit 502 may have an axial symmetry relationship with respect to the extension line L.

At least one of the output lead lines 32 of the first connection unit 501 intersects at least one of the output lead lines 32' of the second connection unit 502.

The input lead lines 31 of the first connection unit 501 do not intersect the input lead lines 31' of the second connection unit 502.

Referring to FIG. 7, the output portion 12 of the first connection unit 501 is disposed between the second side S2' of the second connection unit 502 and a side S3 (hereinafter, a third side) of the first substrate 301. The third side S3 is one of the sides of the first substrate 301 that overlaps the first connection unit 501 or the second connection unit 502.

Figure 8A:
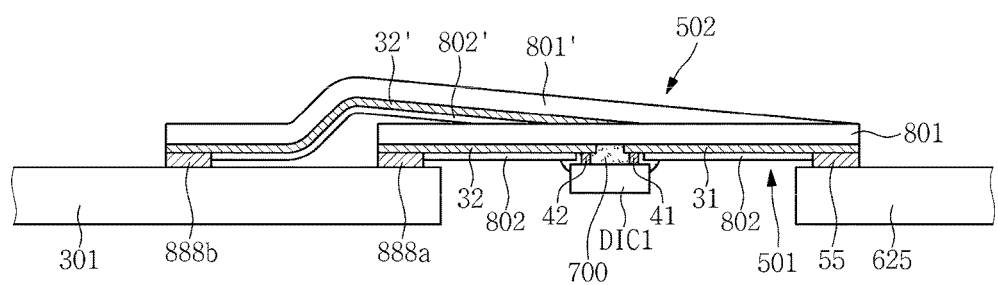
FIGS. 8A and 8B are side views of the display device of FIG. 2 viewed from the direction of an arrow, according to an exemplary embodiment.
Figure 8B:
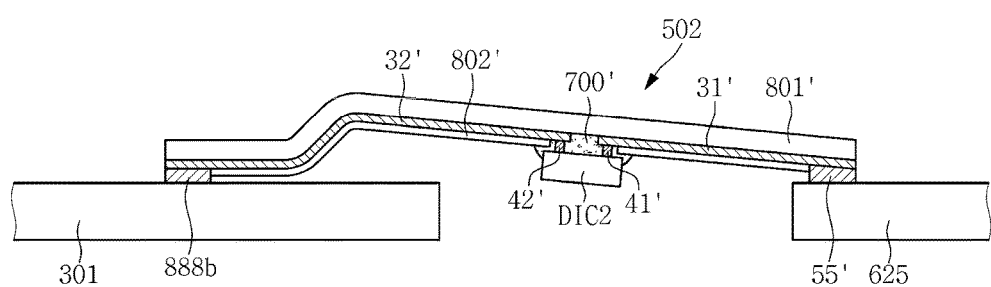

FIGS. 8A and 8B are side views of the display device of FIG. 2 viewed from the direction of an arrow, illustrating the connection between the first substrate 301, the first connection unit 501, the second connection unit 502, and the PCB 625 according to an exemplary embodiment. FIG. 8B is a side view of the display device of FIG. 2 without the first connection unit 501 illustrating the connection between the first substrate 301, the second connection unit 502, and the PCB 625.

Referring to FIG. 8A, the first connection unit 501 includes a base layer 801, the input lead line 31, the output lead line 32, and a cover layer 802.

The base layer 801 may include polyimide.

The cover layer 802 may be a solder resist.

The input lead line 31 and the output lead line 32 are disposed between the base layer 801 and the cover layer 802.

One end portion of the input lead line 31 is connected to the input terminal 41 of the first data driving IC DIC1 through the mounting portion 10 (refer to FIG. 7) of the cover layer 802, and another end portion of the input lead line 31 is connected to the pad terminal 55 of the PCB 625 through the input portion 11 (refer to FIG. 7) of the cover layer 802.

One end portion of the output lead line 32 is connected to the output terminal 42 of the first data driving IC DIC1 through the mounting portion 10 (refer to FIG. 7) of the cover layer 802, and another end portion of the output lead line 32 is connected to the odd-numbered pad terminal 888a of the first substrate 301 through the output portion 12 (refer to FIG. 7) of the cover layer 802.

The first data driving IC DIC1 may be attached to the first connection unit 501 through an adhesive member 700.

Referring to FIG. 8B, the second connection unit 502 includes a base layer 801', the input lead line 31', the output lead line 32', and a cover layer 802'.

The input lead line 31' and the output lead line 32' are disposed between the base layer 801' and the cover layer 802'.

The base layer 801' may include polyimide.

The cover layer 802' may be a solder resist.

One end portion of the input lead line 31' is connected to the input terminal 41' of the second data driving IC DIC2 through the mounting portion 10' (refer to FIG. 7) of the cover layer 802', and another end portion of the input lead line 31' is connected to said another pad terminal 55' of the PCB 625 through the input portion 11' (refer to FIG. 7) of the cover layer 802'.

One end portion of the output lead line 32' is connected to the output terminal 42' of the second data driving IC DIC2 through the mounting portion 10' (refer to FIG. 7) of the cover layer 802', and another end portion of the output lead line 32' is connected to the even-numbered pad terminal 888b of the first substrate 301 through the output portion 12' (refer to FIG. 7) of the cover layer 802'.

The second data driving IC DIC2 may be attached to the second connection unit 502 through an adhesive member 700'.

The display device according to an exemplary embodiment may further include a plurality of third pad terminals to a plurality of n-th pad terminals respectively arranged along third to n-th rows (n being a natural number equal to or greater than 3), and third to n-th connection units overlapping at least one of the first connection unit 501 and the second connection unit 502, wherein n may be 0 or a natural number greater than 3.

The plurality of third pad terminals to the plurality of n-th pad terminals may be disposed in the non-display area 301b.

The third to n-th connection units may be connected to the plurality of third pad terminals to the plurality of n-th pad terminals, respectively. That is, a k-th connection unit may be connected to a plurality of k-th pad terminals, wherein k is a number defined by n.

In such an exemplary embodiment, the display device may further include third to n-th data driving ICs connected to the third to n-th connection units, respectively. A k-th data driving IC is connected to the k-th connection unit.

The display device may further include third to n-th link lines connected to the third to n-th pad terminals, respectively, and data lines connected to the third to n-th link lines, respectively.

In an exemplary embodiment, the first connection unit 501 and the second connection unit 502 may be attached to the first substrate 301 through a single attaching process. For example, an anisotropic conductive film may be disposed on the pad terminals 888a and 888b on the first substrate 301. The anisotropic conductive film may contact the entirety of the pad terminals including the odd-numbered pad terminals 888a and the even-numbered pad terminals 888b.

Subsequently, the first connection unit 501 is disposed on the anisotropic conductive film overlapping the odd-numbered pad terminals 888a of the first substrate 301, and the second connection unit 502 is disposed on the anisotropic conductive film overlapping the even-numbered pad terminals 888b of the first substrate 301. A portion of the second connection unit 502 may be disposed over the first connection unit 501.

Subsequently, the first connection unit 501 and the second connection unit 502 are simultaneously pressed. The first connection unit 501 and the second connection unit 502 may be simultaneously attached to the first substrate 301 by the pressing process.

Figure 9:
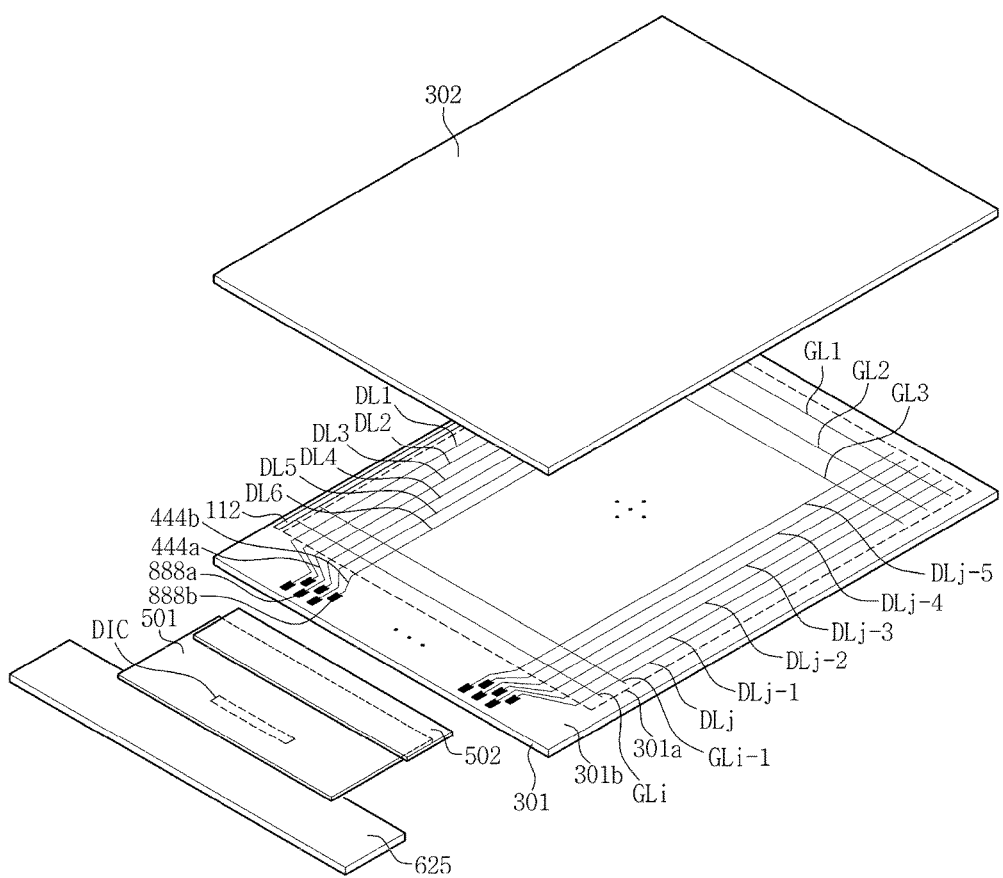
FIG. 9 is an exploded perspective view of a display device according to an exemplary embodiment.
Figure 10:
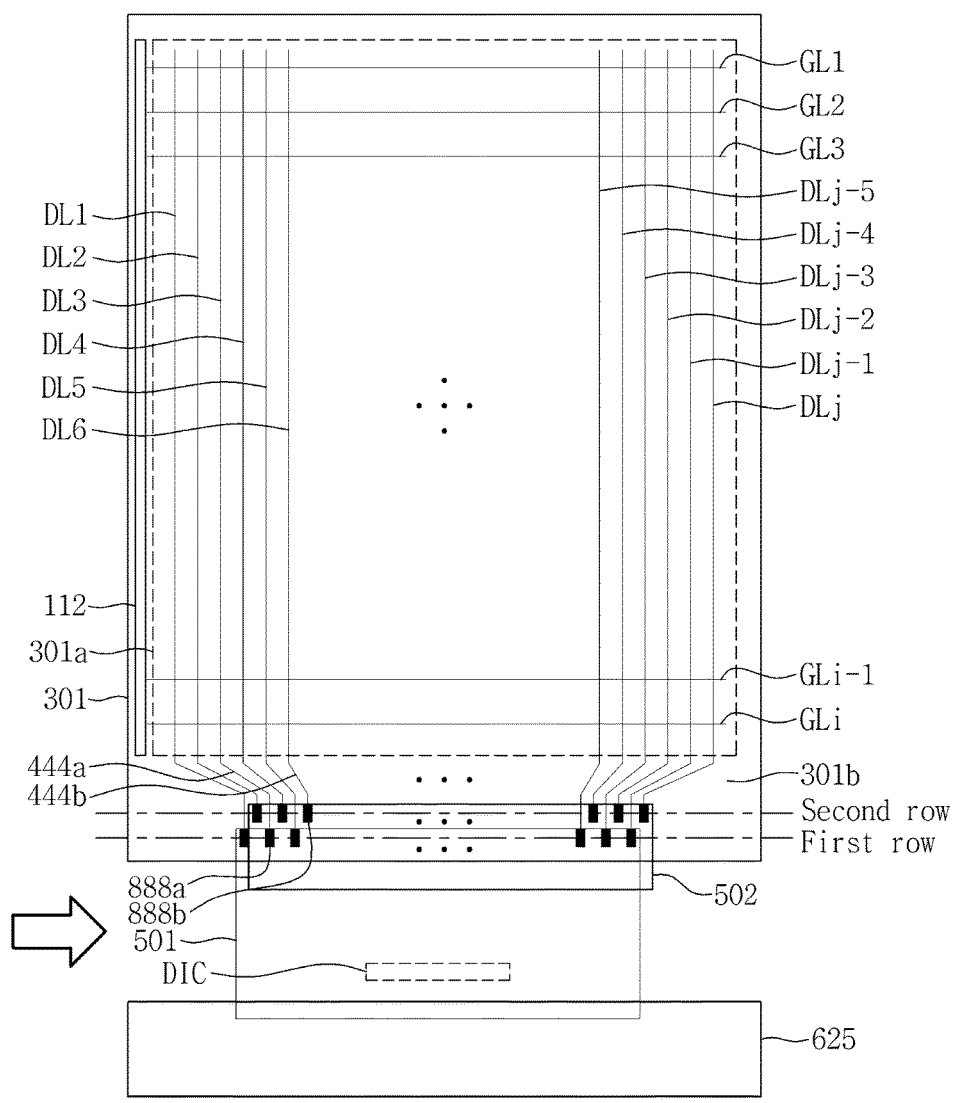
FIG. 10 is a plan view illustrating a first substrate, a data driving IC, a first connection unit, a second connection unit, and a PCB of FIG. 9 when they are coupled to one another.

FIG. 9 is an exploded perspective view of a display device according to an exemplary embodiment, and FIG. 10 is a plan view of the display device of FIG. 9 including a first substrate 301, a data driving IC DIC, a first connection unit 501, a second connection unit 502, and a PCB 625, according to an exemplary embodiment.

Referring to FIG. 9, the display device according to an exemplary embodiment includes the first substrate 301, a second substrate 302, a gate driver 112, the data driving IC DIC, the first connection unit 501, the second connection unit 502, a plurality of gate lines GL1 to GLi, a plurality of data lines DL1 to DLj, and the PCB 625.

Detail descriptions of the first substrate 301, the second substrate 302, the gate driver 112, the plurality of gate lines GL1 to GLi, and the plurality of data lines DL1 to DLj illustrated in FIG. 9 may be refer to the descriptions of the first substrate 301, the second substrate 302, the gate driver 112, the plurality of gate lines GL1 to GLi, and the plurality of data lines DL1 to DLj of FIG. 1.

Each data line extends to the non-display area 301b to be connected to one of the first connection unit 501 and the second connection unit 502. For example, among the data lines DL1 to DLj, odd-numbered data lines DL1, DL3, DL5, . . . , DLj-5, DLj-3, and DLj-1 may be connected to the first connection unit 501, and even-numbered data lines DL2, DL4, DL6, . . . , DLj-4, DLj-2, and DLj may be connected to the second connection unit 502.

The data line may be connected to corresponding one of the connection units through link lines 444a and 444b. For example, the odd-numbered data lines DL1, DL3, DL5, . . . , DLj-5, DLj-3, and DLj-1 may be connected to the first connection unit 501 through odd-numbered link lines 444a, respectively, and the even-numbered data lines DL2, DL4, DL6, . . . , DLj-4, DLj-2, and DLj may be connected to the second connection unit 502 through even-numbered link lines 444b, respectively. The number of the link lines is equal to the number of the data lines.

A portion of the link line connected to the corresponding connection unit is to be defined as pad terminals 888a and 888b of the link line. The pad terminals 888a and 888b may be disposed at an end portion of the link lines 444a and 444b. The pad terminals 888a and 888b may have a larger area than an area of another portion of the link line 444a or 444b.

Between the pad terminals 888a and 888b, a pad terminal 888a (hereinafter, an odd-numbered pad terminal) of the odd-numbered link line 444a is connected to the odd-numbered data line, and a pad terminal 888b (hereinafter, an even-numbered pad terminal) of the even-numbered link line 444b is connected to the even-numbered data line.

Referring to FIGS. 9 and 10, the odd-numbered pad terminals 888a and the even-numbered pad terminals 888b are arranged along different rows, respectively. For example, the odd-numbered pad terminals 888a are arranged in a line along a first row that is farther away from the display area 301a than the even-numbered pad terminals 888b, and the even-numbered pad terminals 888b are arranged in a line along a second row that is disposed closer to the display area 301a than the odd-numbered pad terminals 888a.

In other words, the odd-numbered pad terminals 888a are disposed in a portion of the non-display area 301b farther away from the display area 301a than a portion of the non-display area 301b in which the even-numbered pad terminals 888b are disposed, and are arranged therein in the first row extending parallel to a length direction of the gate line. In addition, the even-numbered pad terminals 888b are disposed in a portion of the non-display area 301b that is closer to the display area 301a than a portion of the non-display area 301b in which the odd-numbered pad terminals 888a are disposed, and are arranged therein in the second row extending parallel to the length direction of the gate line.

The even-numbered pad terminal 888b is disposed between two adjacent odd-numbered link lines 444a. A rightmost one of the even-numbered pad terminals 888b, i.e., a last pad terminal, is disposed between a rightmost one of the odd-numbered link lines 444a and a right edge of the first substrate 301.

According to an exemplary embodiment, the pad terminals in the first row may not be an odd-numbered pad terminal. For example, the pad terminals in the first row may include at least one odd-numbered pad terminal 888a and at least one even-numbered pad terminal 888b. In addition, the pad terminals in the second row may not be an even-numbered pad terminal. For example, the pad terminals in the second row may include at least one odd-numbered pad terminal 888a and at least one even-numbered pad terminal 888b that are different from the pad terminals in the first row. However, at least one pad terminal in the second row is disposed between two link lines 444a that are respectively connected to two pad electrodes in the first row. In such an exemplary embodiment, the two pad electrodes in the first row are adjacent to each other.

The first connection unit 501 is connected to the first substrate 301 and the PCB 625. For example, an input portion of the first connection unit 501 may be electrically connected to the PCB 625, and an output portion of the first connection unit 501 may be electrically connected to the non-display area 301b of the first substrate 301.

The first connection unit 501 and the first substrate 301 may be electrically connected to each other by an anisotropic conductive film. Similarly, the first connection unit 501 and the PCB 625 may be electrically connected to each other by an anisotropic conductive film.

The output portion of the first connection unit 501 is connected to the odd-numbered pad terminals 888a. In other words, the output portion of the first connection unit 501 is connected to the odd-numbered pad terminals 888a arranged along the first row. According to an exemplary embodiment, the first connection unit 501 may not be connected only to the odd-numbered pad terminals 888a. For example, the first connection unit 501 may be connected to at least a part of the entire pad terminals. The at least a part of the entire pad terminals may include at least one odd-numbered pad terminal 888a and at least one even-numbered pad terminal 888b.

The second connection unit 502 is connected to the first connection unit 501 and the first substrate 301. For example, an input portion of the second connection unit 502 may be electrically connected to the first connection unit 501, and an output portion of the second connection unit 502 may be electrically connected to the non-display area 301b of the first substrate 301.

The second connection unit 502 and the first substrate 301 may be electrically connected to each other by an anisotropic conductive film. Similarly, the second connection unit 502 and the first connection unit 501 may be electrically connected to each other by an anisotropic conductive film.

The output portion of the second connection unit 502 is connected to the even-numbered pad terminals 888b. In other words, the output portion of the second connection unit 502 is connected to the even-numbered pad terminals 888b arranged along the second row. According to an exemplary embodiment, the second connection unit 502 may not be connected only to the even-numbered pad terminals 888b. For example, the second connection unit 502 may be connected to the pad terminals that are not connected to the first connection unit 501. The pad terminals connected to the second connection unit 502 may include at least one odd-numbered pad terminal 888a and at least one even-numbered pad terminal 888b. However, at least one pad terminal connected to the second connection unit 502 is disposed between two link lines connected to the first connection unit 501 through pad terminals. In such an exemplary embodiment, the two link lines connected to the first connection unit 501 are adjacent to each other.

At least one of the odd-numbered pad terminals 888a connected to the first connection unit 501 is connected to a link line 444a passing between the even-numbered pad terminals 888b connected to the second connection unit 502. For example, referring to FIG. 10, one odd-numbered pad terminal 888a connected to the third data line DL3 is connected to the first connection unit 501, and a link line 444a through which the third data line DL3 is connected to said odd-numbered pad terminal 888a extends past the two adjacent even-numbered pad terminals 888b. The two adjacent even-numbered pad terminals 888b are connected to the second connection unit 502. In other words, at least one of the odd-numbered data lines DL1, DL3, DL5, . . . , DLj−5, DLj−3, and DLj−1 connected to the first connection unit 501 is disposed between two adjacent even-numbered data lines connected to the second connection unit 502.

At least one of the even-numbered pad terminals 888b connected to the second connection unit 502 is disposed between the odd-numbered link lines 444a connected to the first connection unit 501. For example, referring to FIG. 10, an even-numbered pad terminal 888b connected to the second data line DL2 is connected to the second connection unit 502, and the even-numbered pad terminal 888b connected to the second data line DL2 is disposed between the two adjacent odd-numbered link lines 444a. The two adjacent odd-numbered link lines 444a are connected to the first connection unit 501 through respective pad terminals 888a. In other words, at least one of the even-numbered data lines DL2, DL4, DL6, . . . , DLj−4, DLj−2, and DLj connected to the second connection unit 502 may be disposed between the two adjacent odd-numbered data lines connected to the first connection unit 501.

The first connection unit 501 disposed overlapping at least a part of the second connection unit 502. For example, at least a portion of the first connection unit 501 overlaps the second connection unit 502.

Referring to FIGS. 9 and 10, a portion of the first connection unit 501 may be disposed between the first substrate 301 and the second connection unit 502. For example, in an area where the first connection unit 501 overlaps the second connection unit 502, a portion of the first connection unit 501 may be disposed between the first substrate 301 and the second connection unit 502.

The second connection unit 502 overlaps at least one of the odd-numbered pad terminals 888a.

At least one of the first connection unit 501 and the second connection unit 502 may be a tape carrier. At least one of the first connection unit 501 and the second connection unit 502 may also be a flexible printed circuit (FPC).

The data driving IC DIC is connected to the first connection unit 501. To this end, the data driving IC DIC may be mounted on the first connection unit 501. For example, the data driving IC DIC may be electrically connected to the first connection unit 501 by surface mounting technology.

The data driving IC DIC is connected to the odd-numbered pad terminals 888a through the first connection unit 501. For example, at least a part of the output terminals of the data driving IC DIC are connected to the odd-numbered pad terminals 888a, respectively, through the output portion of the first connection unit 501. Accordingly, the at least a part of the output terminals of the data driving IC DIC are connected to the odd-numbered data lines DL1, DL3, DL5, . . . , DLj−5, DLj−3, and DLj−1 through the odd-numbered link lines 444a, respectively.

The data driving IC DIC is connected to the even-numbered pad terminals 888b through the first connection unit 501 and the second connection unit 502. For example, others of the output terminals of the data driving IC DIC that are not connected to the odd-numbered pad terminals 888a are connected to the even-numbered pad terminals 888b, respectively, through an intermediate output portion of the first connection unit 501 and the output portion of the second connection unit 502. Accordingly, the others of the output terminals of the data driving IC DIC are connected to the even-numbered data lines DL2, DL4, DL6, . . . , DLj−4, DLj−2, and DLj through the even-numbered link lines 444b, respectively.

The data driving IC DIC provides image data signals to the data lines DL1 to DLj.

Figure 11:
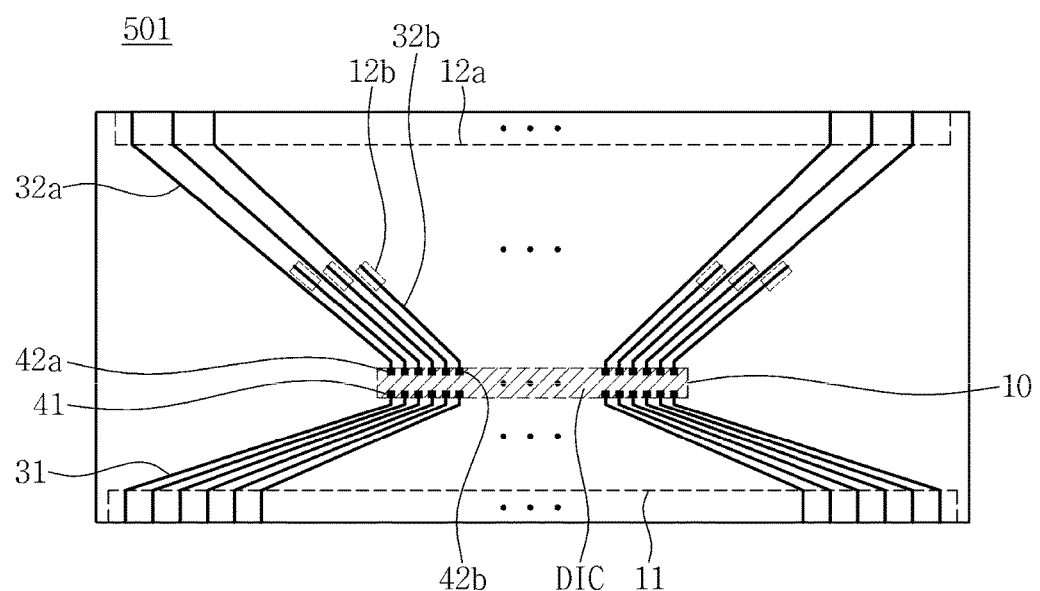
FIG. 11 is a plan view of the first connection unit of FIG. 10, according to an exemplary embodiment.
Figure 12:
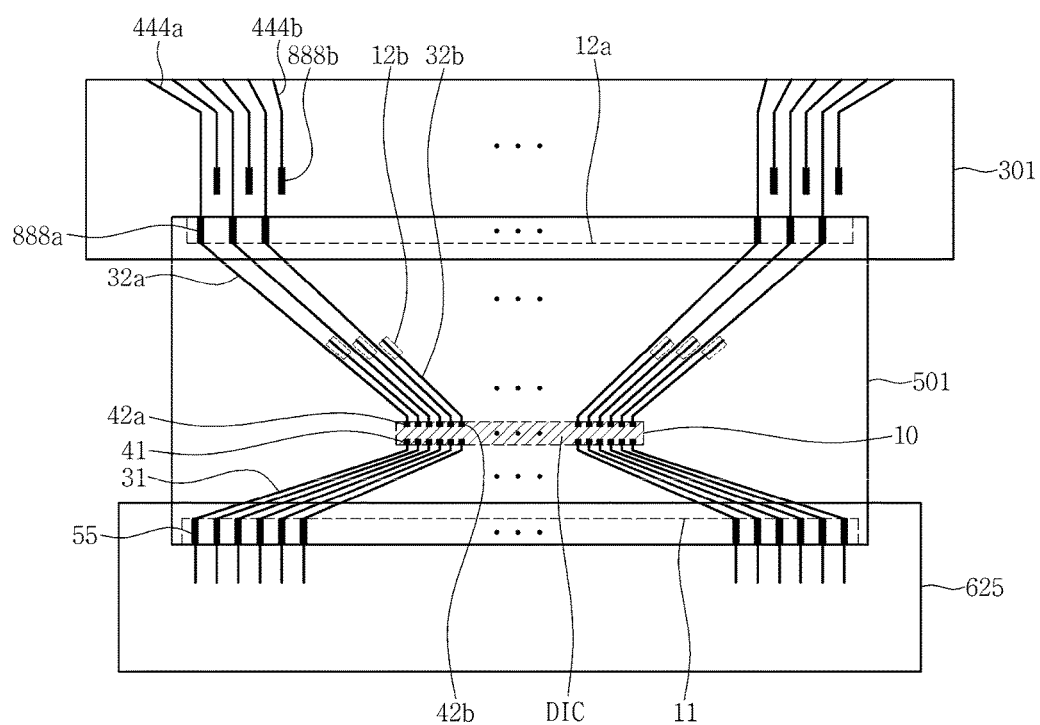
FIG. 12 is a plan view illustrating electrical connections between the first connection unit of FIG. 11, the PCB, and the first substrate, according to an exemplary embodiment.

FIG. 11 is a plan view of the first connection unit 501 of FIG. 10, and FIG. 12 is a plan view illustrating electrical connections between the first connection unit 501 of FIG. 11, the PCB 625, and the first substrate 301, according to an exemplary embodiment.

Referring to FIG. 11, the first connection unit 501 includes a plurality of input lead lines 31, a plurality of output lead lines 32a and 32b, a mounting portion 10, an input portion 11, an output portion 12a, and an intermediate output portion 12b.

The data driving IC DIC is mounted on the mounting portion 10. The mounting portion 10 and the intermediate output portion 12b are disposed between the input portion 11 and the output portion 12a.

Referring to FIG. 12, the input portion 11 is connected to the PCB 625, the output portion 12a is connected to the first substrate 301, and the intermediate output portion 12b is connected to the second connection unit 502.

Referring to FIG. 11, the input lead lines 31 are connected to input terminals 41 of the data driving IC DIC, respectively. In addition, referring to FIG. 12, the input lead lines 31 are connected to pad terminals 55 of the PCB 625, respectively. For example, one end portion of the input lead line 31 is connected to the input terminal 41 of the data driving IC DIC, and another end portion of the input lead line 31 is connected to the pad terminal 55 of the PCB 625.

One end portion of each input lead line 31 is exposed from the first connection unit 501 through the mounting portion 10 and another end portion of each input lead line 31 is exposed from the first connection unit 501 through the input portion 11.

Referring to FIG. 11, the output lead lines 32a are connected to the output terminals 42a of the data driving IC DIC, respectively. For example, odd-numbered output lead lines 32a of the first connection unit 501 may be connected to odd-numbered output terminals 42a of the data driving IC DIC, respectively. In addition, referring to FIG. 12, the output lead lines 32a are connected to the odd-numbered pad terminals 888a of the first substrate 301, respectively. For example, one end portion of the odd-numbered output lead line 32a is connected to the odd-numbered output terminal 42a of the data driving IC DIC, and another end portion of the odd-numbered output lead line 32a is connected to the odd-numbered pad terminal 888a of the first substrate 301.

Referring to FIG. 11, the output lead lines 32b are connected to the output terminals 42b of the data driving IC DIC, respectively. For example, even-numbered output lead lines 32b of the first connection unit 501 may be connected to even-numbered output terminals 42b of the data driving IC DIC, respectively. In addition, the even-numbered output lead lines 32b are connected to the second connection unit 502. For example, one end portion of the even-numbered output lead line 32b is connected to the even-numbered output terminal 42b of the data driving IC DIC, and another end portion of the even-numbered output lead line 32b is connected to the second connection unit 502.

One end portion of each even-numbered output lead line 32b is exposed from the first connection unit 501 through the mounting portion 10 and another end portion of each even-numbered output lead line 32b is exposed from the first connection unit 501 through the intermediate output portion 12b.

Figure 13:
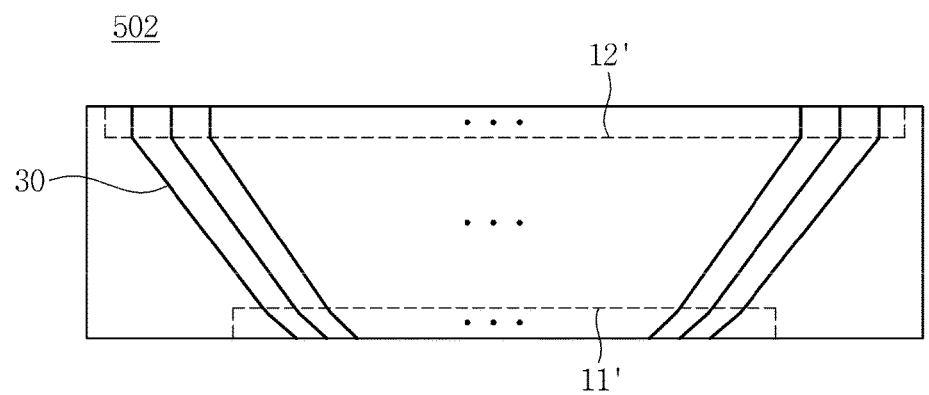
FIG. 13 is a plan view of the second connection unit of FIG. 10, according to an exemplary embodiment.
Figure 14:
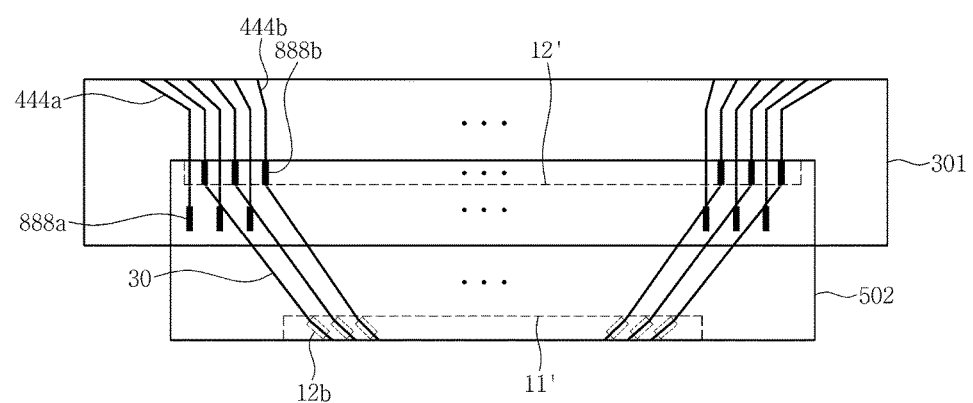
FIG. 14 is a plan view illustrating electrical connections between the second connection unit of FIG. 13 and the first substrate, according to an exemplary embodiment.

FIG. 13 is a plan view of the second connection unit 502 of FIG. 10, and FIG. 14 is a plan view illustrating electrical connections between the second connection unit 502 of FIG. 13 and the first substrate 301, according to an exemplary embodiment.

Referring to FIG. 13, the second connection unit 502 includes a plurality of lead lines 30, an input portion 11', and an output portion 12'.

The input portion 11' is connected to the first connection unit 501, and the output portion 12' is connected to the first substrate 301.

Referring to FIG. 14, the lead lines 30 are connected to the even-numbered output lead lines 32b of the first connection unit 501, respectively. Also, the lead lines 30 are connected to the even-numbered pad terminals 888b of the first substrate 301, respectively. For example, one end portion of the lead line 30 is connected to the intermediate output portion 12b of the first connection unit 501, and another end portion of the lead line 30 is connected to the even-numbered pad terminal 888b of the first substrate 301.

One end portion of each lead line 30 is exposed from the second connection unit 502 through the input portion 11' and another end portion of each lead line 30 is exposed from the second connection unit 502 through the output portion 12'.

Figure 15:
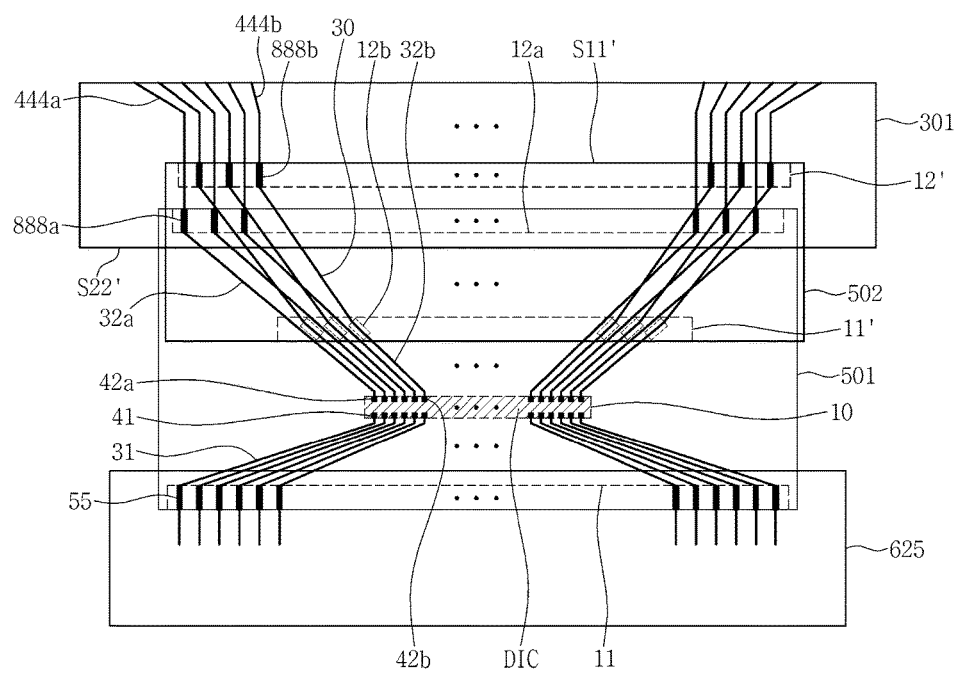
FIG. 15 is a plan view illustrating electrical connections between the first connection unit of FIG. 11 and the second connection unit of FIG. 13, according to an exemplary embodiment.

FIG. 15 is a plan view illustrating electrical connections between the first connection unit 501 of FIG. 11 and the second connection unit 502 of FIG. 13, according to an exemplary embodiment.

At least one of the odd-numbered output lead lines 32a of the first connection unit 501 intersects at least one of the lead lines 30 of the second connection unit 502.

The input lead lines 31 of the first connection unit 501 do not intersect the lead lines 30 of the second connection unit 502.

From the plan view illustrated in FIG. 15, the output portion 12a of the first connection unit 501 is disposed between a side S11' (hereafter, a first side) of the second connection unit 502 and a side S22' (hereinafter, a second side) of the first substrate 301.

The first side S11' is one of sides of the second connection unit 502 that overlaps the first substrate 301 and does not intersect an edge of the first substrate 301, and the second side S22' is one of sides included in the first substrate 301 that overlaps the first connection unit 501 or the second connection unit 502.

Figure 16:
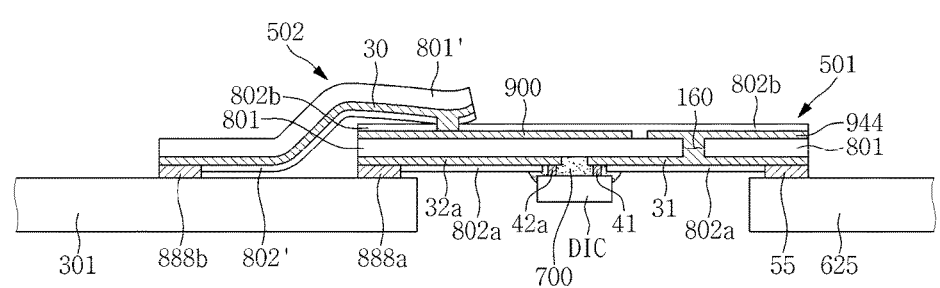
FIG. 16 is a side view of the display device of FIG. 10 viewed from the direction of an arrow, according to an exemplary embodiment.

FIG. 16 is a side view of the display device of FIG. 10 viewed from the direction of an arrow, illustrating the connection between the first substrate 301, the first connection unit 501, the second connection unit 502, and the PCB 625 according to an exemplary embodiment.

Referring to FIG. 16, the first connection unit 501 includes a base layer 801, the input lead line 31, an auxiliary input lead line 944, the odd-numbered output lead line 32a, an auxiliary output lead line 900, a first cover layer 802a, and a second cover layer 802b.

The input lead line 31 is disposed between the first cover layer 802a and the base layer 801.

The base layer 801 may include polyimide.

The first cover layer 802a may be a solder resist.

One end portion of the input lead line 31 is connected to the input terminal 41 of the data driving IC DIC through the mounting portion 10 (refer to FIG. 15) of the first cover layer 802a and another end portion of the input lead line 31 is connected to the pad terminal 55 of the PCB 625 through the input portion 11 (refer to FIG. 15) of the first cover layer 802a. The input lead line 31 may be connected to the auxiliary input lead line 944 through a contact hole 160 of the base layer 801.

The auxiliary input lead line 944 is disposed between the second cover layer 802b and the base layer 801.

The second cover layer 802b may be a solder resist.

The odd-numbered output lead line 32a is disposed between the base layer 801 and the first cover layer 802a.

One end portion of the odd-numbered output lead line 32a is connected to the odd-numbered output terminal 42a of the data driving IC DIC through the mounting portion 10 (refer to FIG. 15) of the first cover layer 802a, and another end portion of the odd-numbered output lead line 32a is connected to the odd-numbered pad terminal 888a of the first substrate 301 through the output portion 12a (refer to FIG. 15) of the first cover layer 802a.

One end portion of the even-numbered output lead line 32b (refer to FIG. 15) is connected to the even-numbered output terminal 42b (refer to FIG. 15) of the data driving IC DIC through the mounting portion 10 (refer to FIG. 15) of the first cover layer 802a, and another end portion of the even-numbered output lead line 32b is connected to the auxiliary output lead line 900 through another contact hole of the base layer 801.

The auxiliary output lead line 900 is disposed between the base layer 801 and the second cover layer 802b. The auxiliary output lead line 900 is connected to the lead line 30 of the second connection unit 502 through the intermediate output portion 12b (refer to FIG. 15) of the second cover layer 802b.

The data driving IC DIC may be attached to the first connection unit 501 through an adhesive member 700.

Referring to FIG. 16, the second connection unit 502 includes a base layer 801', the lead line 30, and a cover layer 802'.

The lead line 30 is disposed between the base layer 801' and the cover layer 802'.

One end portion of the lead line 30 is connected to the auxiliary output lead line 900 of the first connection unit 501 through the input portion 11' (refer to FIG. 15) of the cover layer 802' and the intermediate output portion 12b (refer to FIG. 15) of the cover layer 802'.

Another end portion of the lead line 30 is connected to the even-numbered pad terminal 888b of the first substrate 301 through the output portion 12' (refer to FIG. 15) of the cover layer 802'.

The display device according to an alternative embodiment may further include a plurality of third pad terminals to a plurality of n-th pad terminals respectively arranged along third to n-th rows (n being a natural number equal to or greater than 3), and third to n-th connection units overlapping at least one of the first connection unit 501 and the second connection unit 502, wherein n may be 0 or a natural number greater than 3.

The plurality of third pad terminals to the plurality of n-th pad terminals are disposed in the non-display area 301b.

The third to n-th connection units are connected to the plurality of third pad terminals to the plurality of n-th pad terminals, respectively. That is, a k-th connection unit is connected to a plurality of k-th pad terminals, wherein k is a number defined by n.

The third to n-th connection units are connected to the first connection unit 501.

In addition, in such an exemplary embodiment, the display device may further include third to n-th link lines connected to the third to n-th pad terminals, respectively, and data lines connected to the third to n-th link lines, respectively.

In the present embodiment, the first connection unit 501 and the second connection unit 502 may be attached to the first substrate 301 through a single attaching process, details of which will make reference to the aforementioned descriptions.

As such, the first connection unit 501 is connected to the odd-numbered pad terminals 888a of the pad terminals of the first substrate 301, and the second connection unit 502 is connected to the even-numbered pad terminals 888b of the pad terminals. That is, the first connection unit 501 and the second connection unit 502 are a connection unit of a single layer type, each of which is selectively connected to pad terminals in a single row.

According to exemplary embodiment, a connection unit of a conventional multilayer type is connected to the entirety of pad terminals of a substrate, that is, odd-numbered pad terminals and even-numbered pad terminals.

The conventional multilayer type connection unit generally has a higher unit price than the price of the single layer type connection unit (the first connection unit and the second connection unit). That is, one multilayer type connection unit has a higher price than a price of two single layer type connection units. The multilayer type connection unit includes lead lines disposed at a density higher than that of lead lines of the single layer type connection unit, and therefore, the multilayer type connection unit is more susceptible to defects such as lead line cracks.

Accordingly to the exemplary embodiments, a connection structure may include the single layer type connection units 501 and 502 disposed overlapping one another. The manufacturing costs of the display device may be reduced and a crack defective rate of the connection units may be remarkably reduced.

As set forth above, in one or more embodiments, the display device may provide the following effects.

Connection units of a single layer type are provided to overlap one another. Accordingly, manufacturing costs of the display device may be reduced, and a crack defect rate of the connection unit may be remarkably decreased.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. A display device, comprising:
    a substrate comprising a display area and a non-display area;
    a first pad terminal and a second pad terminal disposed in the non-display area, the first pad terminal arranged along a first row and the second pad terminal arranged along a second row;
    a first connection unit connected to the first pad terminal;
    a first driving integrated circuit connected to the first connection unit;
    a second connection unit connected to the second pad terminal; and
    a second driving integrated circuit connected to the second connection unit,
    wherein the first connection unit is disposed overlapping the second connection unit.

2. The display device as claimed in claim 1, wherein a portion of the first connection unit is disposed between the substrate and the second connection unit.

3. The display device as claimed in claim 1, wherein the second connection unit overlaps at least a portion of the first pad terminal.

4. The display device as claimed in claim 1, further comprising a printed circuit board connected to the first connection unit and the second connection unit.

5. The display device as claimed in claim 4, wherein the first connection unit comprises:
    a first lead line connected to the first pad terminal and a first terminal of the first driving integrated circuit; and
    a second lead line connected to a second terminal of the first driving integrated circuit and the printed circuit board.

6. The display device as claimed in claim 5, wherein the second connection unit comprises:
    a first lead line connected to the second pad terminal and a first terminal of the second driving integrated circuit; and
    a second lead line connected to a second terminal of the second driving integrated circuit and the printed circuit board.

7. The display device as claimed in claim 6, wherein the first lead line of the first connection unit intersects the first lead line of the second connection unit.

8. The display device as claimed in claim 6, wherein the second lead line of the first connection unit does not intersect the second lead line of the second connection unit.

9. The display device as claimed in claim 4, wherein one side of the first connection unit overlaps the substrate and does not intersect an edge of the substrate,
- another side of the first connection unit opposite to the one side of the first connection unit overlaps the printed circuit board and does not intersect an edge of the printed circuit board, and
- the one side of the first connection unit has a longer length than a length of the another side of the first connection unit.

10. The display device as claimed in claim 4, wherein one side of the second connection unit overlaps the substrate and does not intersect an edge of the substrate,
- another side of the second connection unit opposite to the one side of the second connection unit overlaps the printed circuit board and does not intersect an edge of the printed circuit board, and
- the one side of the second connection unit has a longer length than a length of the another side of the second connection unit.

11. The display device as claimed in claim 1, wherein the first connection unit and the second connection unit are symmetric to each other.

12. The display device as claimed in claim 1, further comprising:
- a third pad terminal to an n-th pad terminal, wherein n is a natural number equal to or greater than 3, arranged along a third row to an n-th row, respectively, in the non-display area; and
- a third connection unit to an n-th connection unit connected to the third pad terminal to the n-th pad terminal, respectively, and overlapping at least one of the first connection unit and the second connection unit.

13. A display device, comprising:
- a substrate comprising a display area and a non-display area;
- a first pad terminal and a second pad terminal disposed in the non-display area, the first pad terminal arranged along a first row and the second pad terminal arranged along a second row;
- a first connection unit connected to the first pad terminal;
- a driving integrated circuit disposed on the first connection unit; and
- a second connection unit connected to the second pad terminal and the first connection unit, the second connection unit overlapping the first connection unit.

14. The display device as claimed in claim 13, wherein a portion of the first connection unit is disposed between the substrate and the second connection unit.

15. The display device as claimed in claim 13, wherein the second connection unit overlaps at least a portion of the first pad terminal.

16. The display device as claimed in claim 13, further comprising a printed circuit board connected to the first connection unit.

17. The display device as claimed in claim 16, wherein the first connection unit comprises:
- a first lead line connected to the first pad terminal and a first terminal of the driving integrated circuit;
- a second lead line connected to a second terminal of the driving integrated circuit and the second connection unit; and
- a third lead line connected to a third terminal of the driving integrated circuit and the printed circuit board.

18. The display device as claimed in claim 17, wherein the second connection unit comprises a lead line connected to the second pad terminal and one of the second terminal and the second lead line.

19. The display device as claimed in claim 13, further comprising:
- a third pad terminal to an n-th pad terminal, wherein n is a natural number equal to or greater than 3, arranged along a third row to an n-th row, respectively, in the non-display area; and
- a third connection unit to an n-th connection unit connected to the third pad terminal to the n-th pad terminal, respectively, and overlapping at least one of the first connection unit and the second connection unit,
- wherein the third connection unit to the n-th connection unit are connected to the first connection unit.

* * * * *